United States Patent
Lee et al.

(10) Patent No.: US 8,729,382 B2
(45) Date of Patent: May 20, 2014

(54) PHOTOVOLTAIC-CHARGED SECONDARY BATTERY SYSTEM

(75) Inventors: Joong Kee Lee, Seoul (KR); Byung Won Cho, Seoul (KR); Kyung Yoon Chung, Seoul (KR); Hyung Sun Kim, Seoul (KR); Il Doo Kim, Seoul (KR); Chan Wook Jeon, Seoul (KR); Yong Sang Kim, Yongin-si (KR)

(73) Assignee: Korea Institute of Science and Technology, Seoul (KR)

( * ) Notice: Subject to any disclaimer, the term of this patent is extended or adjusted under 35 U.S.C. 154(b) by 730 days.

(21) Appl. No.: 11/962,273

(22) Filed: Dec. 21, 2007

(65) Prior Publication Data

US 2009/0072780 A1    Mar. 19, 2009

(30) Foreign Application Priority Data

Sep. 13, 2007    (KR) .................... 10-2007-0092928

(51) Int. Cl.
*H01L 31/058*    (2006.01)
(52) U.S. Cl.
USPC ........................................................ 136/248
(58) Field of Classification Search
USPC .................. 136/243–265; 438/57–98; 429/9
See application file for complete search history.

(56) References Cited

U.S. PATENT DOCUMENTS

| | | | | |
|---|---|---|---|---|
| 4,740,431 A | * | 4/1988 | Little | 429/9 |
| 4,965,655 A | * | 10/1990 | Grimmer et al. | 257/56 |
| 6,252,156 B1 | * | 6/2001 | Ono et al. | 136/256 |
| 2006/0076051 A1 | * | 4/2006 | Watanabe et al. | 136/263 |

FOREIGN PATENT DOCUMENTS

JP    2005116324 A  *  4/2005  ............ H01M 10/40

OTHER PUBLICATIONS

English machine translation of Takeuchi et al. (JP 2005-116324) published Apr. 2005.*

* cited by examiner

*Primary Examiner* — Jonathan Johnson
*Assistant Examiner* — Christina Chern
(74) *Attorney, Agent, or Firm* — Frommer Lawrence & Haug LLP; Ronald R. Santucci

(57) ABSTRACT

A photovoltaic-charged secondary battery system is provided, in which an electrode for optical power generation and an electrode for charging and discharging generated electrical energy are integrated into a single cell structure, and the potential difference between the electrodes is systematically controlled, thus maximizing the conversion efficiency of optical energy, maximizing the utilization rate of cell energy, and extending the life span of the battery. Thus, the photovoltaic-charged secondary battery system may include a transparent electrode capable of transmitting light; a PN semiconductor layer formed on the transparent electrode and generating a current by incident light; and a secondary battery layer, formed on the PN semiconductor layer, in which the current generated by the PN semiconductor layer is charged.

22 Claims, 12 Drawing Sheets

PHOTOVOLTAIC-CHARGED SECONDARY BATTERY SYSTEM

CROSS-REFERENCE TO RELATED APPLICATION

This application claims priority to and the benefit of Korean Patent Application No. 10-2007-0092928, filed on Sep. 13, 2007, the disclosure of which is incorporated herein by reference in its entirety.

BACKGROUND OF THE INVENTION

1. Field of the Invention

The present invention relates to a photovoltaic-chargeable secondary battery system and, more particularly, to a photovoltaic-charged secondary battery system, in which an electrode for optical power generation and an electrode for charging and discharging generated electrical energy are integrated into a single cell structure, and the potential difference between the electrodes is systematically controlled, thus maximizing the conversion efficiency of optical energy, maximizing the utilization rate of cell energy, and extending the life span of the battery.

2. Description of the Related Art

Information communications between individuals become very important in the 21st century knowledge-based society. Accordingly, there have been steady efforts to create a ubiquitous society by building ultra-high speed communication networks and knowledge sharing systems, and thus there arises a necessity for developing energy sources suitable for communication systems of the ubiquitous era.

Most of today's energy supply systems are large scale stationary sources in one-way direction such as nuclear power, waterpower and thermal power generation, and have problems such as inefficiency caused by an imbalance between generation and consumption, disposal of surplus electric power, environmental destruction, and large scale power transmission.

To solve such problems, the energy supply systems should be shifted to a new paradigm for the energy production and consumption of the next generation. That is, it is expected that the energy supply systems will be developed from the one-way structure, in which the power generation and transmission are provided from the stationary generation facilities in a large scale, to individual and independent structures, in which the power generation and consumption are provided in a small scale. Accordingly, it is necessary to create a new concept of power system in which the power generation and storage techniques are merged.

Meanwhile, the most leading secondary battery is a lithium secondary battery including cathode made of a metal oxide and an anode made of carbon.

Since the conversion of chemical energy into electrical energy is reversible in the lithium secondary battery, it is possible to repeat charge and discharge; however, there are limitations to an increase in capacity per unit volume and unit weight according to theoretical capacity limits of electrode active materials. Moreover, since a periodic charge using a charger is required, there is much inconvenience in use. In addition, although extensive research aimed at upsizing the secondary battery has continued to progress, there are a lot of problems to be solved such as safety. [Byung-won Jo, "Analysis on Technologies and Market Trends of Next-generation Secondary Battery for Hybrid Electric Vehicle", 2007' Next-generation Battery Technologies/Market Trends Analysis Seminar, Korea International Battery & Cell Industry Exhibition 2007, May 9-10, 2007, Seoul].

Meanwhile, photovoltaic cells are broadly classified silicon cells and compound semiconductor cells which directly convert light energy into electrical energy through the photovoltaic effect using a p-n junction in a semiconductor having the same structure as a diode [Su-hong Lee, "Polymer Science and Technology, 17(4), 400-406(2006)]. With extensive research on the photovoltaic cells having continued to progress for the past decades, various types of electrodes as well as materials have been developed, and there are significant improvements in photoelectric conversion efficiency. However, there are limitations on the field of energy utilization due to low energy density, low conversion efficiency in the unit cell, and low output voltage.

Accordingly, in the initial stage, the research aimed at associating the photovoltaic cell capable of generating electrical power using light with a storage battery storing the electrical energy was carried out in preparation for the case where the photovoltaic cell could not generate electrical power in night or on rainy days. Such a photovoltaic cell associated with the storage battery is applied to a streetlight, an emergency telephone, and the like, which can be used without an external power supply [In-sun Seo, Change-geol Park, Kang-hee Kim, Young-il Kwon, Young-seo Park, National Strategic Industry Analysis Report "Photovoltaic Cell", Korea Institute of Science and Technology Information, BW125, December 2000].

Thus, extensive research aimed at associating the photovoltaic cell with the storage battery has been carried out. For example, Japanese Publication Nos. JP2005-079031, JP2004-241228 and JP2005-209458 by Miyasaka et al. disclose a photoelectric cell in which an electrode performance for optical power generation and an electrode performance for charging are integrated into one electrode material. In such a photoelectric cell, a photoelectrode layer and a counter layer are laminated and integrated at both sides of an ionic electrolyte layer as an intermediate layer, in which the photoelectrode layer is structured by a combination of a photosensitive semiconductor and a solid electrode active material making an oxidation-reduction reaction in electrically coupling with the semiconductor, thus providing a secondary battery capable of optical charging and an electrochemical capacitor. It is disclosed that, in the event that $TiO_2$ is used as a photosensitive material incapable of absorbing visible light, the charging capacity is as low as 0.1 to 0.8 mAh/g; however, in the event that the compound semiconductor (CdS) capable of absorbing visible light with a wavelength of 400 nm or more, the charging capacity is increased to 2.1 mAh/g.

Moreover, Japanese Patent Publication Nos. JP2001-023701, JP2001-10294, JP2001-043903 and JP2001-076768, and Korean Patent Publication No. KP2001-0015248 by Watanabe et al. of Sony Corp. disclose a photovoltaic-charged secondary battery with a combination of a photoelectric conversion device and a storage battery used as a dry battery. The photovoltaic-charged secondary battery is provided with a cylindrical core, a photoelectric conversion sheet wound to be freely drawn out from the cylindrical core, a storage battery capable of charging and discharging, and a control circuit. The storage battery is charged by the photoelectric conversion sheet wound on the cylindrical space, if necessary, and the charged storage battery is separated from a cylindrical assembly to be used as a dry battery.

However, the conventional photovoltaic-charged secondary battery has the following problems.

1) Since energy generated from a photovoltaic cell has a low driving voltage of −0.4 to 0.9V and a low energy density, the photovoltaic cell is formed with a large area. Accordingly, the photovoltaic-charged secondary battery is fabricated in the form of a module in which a plurality of photovoltaic cells is connected. Moreover, since it is necessary to artificially make a voltage suitable for the charging voltage of the secondary battery, i.e., 3.6 to 4.2V, the interfacial resistance is concentrated on the connection surface, and recombination of electric charges occurs during transfer, and thus the modulated photovoltaic cells show a very low efficiency compared with a unit cell [Kessler et al. Thin Solid Films, 480-481 (2006)491].

2) The conventional technology of the integration of the photoelectric cell and the storage battery, disclosed in Japanese Publication Nos. JP2005-079031, JP2004-241228 and JP2005-209458 by Miyasaka et al., converts optical energy into electric energy using one electrode and stores the electric energy at the same time. However, since the electrode has the same potential, the charging energy is readily saturated, which results in a small capacity, and self-discharge of the electrode occurs readily. Moreover, the deterioration proceeds rapidly and thus the cycle lifespan does not exceed ten times.

3) The photovoltaic-charged secondary battery provided with the cylindrical core, the photoelectric conversion sheet wound to be freely drawn out from the cylindrical core, and the storage battery capable of charging and discharging, disclosed in Japanese Patent Publication Nos. JP2001-023701, JP2001-102094, JP2001-043903 and JP2001-076768, and Korean Patent Publication No. KP2001-0015248, has the same structure in which a plurality of photovoltaic cells is combined. Accordingly, the power generation efficiency and the charging performance are likely to deteriorate due to the low energy efficiency and the photoelectric conversion sheet which is rolled up and readily damaged.

4) It is required to provide a high efficiency battery capable of coping with the speed of electricity generation of a photoelectric conversion layer when charging the battery. Since a secondary battery placed at the bottom of the photoelectric conversion layer is heated to a high temperature by the received light, the internal pressure may excessively increase by the decomposition of electrolyte due to the high temperature. Accordingly, it is necessary to develop a suitable material and the associated system.

As described above, two kinds of elements including the optical power generation function and the charging function are mechanically combined or integrated into one electrode material according to the conventional technologies. However, there is not yet any method, in which optical energy is converted into electricity and, at the same time, immediately charged into a secondary battery to reduce energy loss, the potential difference between electrodes are systematically controlled to maximize the conversion efficiency of optical energy, maximize the energy utilization rate, and provide a long life span.

Accordingly, it is necessary to develop a photovoltaic-charged secondary battery system in which an electrode for converting optical energy into electricity and an electrode for charging the electrical energy have independent functions and are integrated to solve the above-described conventional problems.

SUMMARY OF THE INVENTION

Accordingly, the present invention provides a photovoltaic-charged secondary battery system in which a photoelectric conversion layer for converting optical energy into electricity is formed on a transparent polymer film coated with a transparent metal oxide and an electricity storage layer capable of controlling voltage independently is formed at the bottom thereof so as to store the electrical energy generated from the photoelectric conversion layer in the electricity storage layer, thus maximizing energy efficiency.

Moreover, the present invention provides a photovoltaic-charged secondary battery system capable of preventing a reduction in energy efficiency and solving the complexity of a process of connecting circuits due to a structure in which a plurality of photovoltaic cells is combined to increase output voltage of a photovoltaic cell.

Furthermore, the present invention provides a method of manufacturing a high efficiency battery coping with the speed of electricity generation of a photoelectric conversion layer.

In addition, the present invention provides a photovoltaic-charged secondary battery system capable of increasing the energy efficiency of the photoelectric conversion layer and maintaining a high performance even after a long term use.

Moreover, the present invention provides a photovoltaic-charged secondary battery system capable of preventing the internal pressure from being excessively increased by the decomposition of electrolyte caused as a secondary battery layer placed at the bottom of the photoelectric conversion layer is heated to a high temperature while the photoelectric conversion layer receives and generates electricity.

Furthermore, the present invention provides a photovoltaic-charged secondary battery system capable of being used as a hybrid power system, in which an environment-friendly energy generation system and an energy storage system are merged, thus solving the problem of necessity of the periodic charge, the problem of safety and the problem of limitations on an increase in capacity. Accordingly, the photovoltaic-charged secondary battery system of the present invention can be used as a major power source required for realizing ubiquitous society, solve the international environmental problems, and have excellent impact resistance and durability.

In accordance with an aspect of the present invention, there is provided a photovoltaic-charged secondary battery system comprising: a transparent electrode capable of transmitting light; a PN semiconductor layer formed on the transparent electrode and generating a current by incident light; and a secondary battery layer, formed on the PN semiconductor layer, in which the current generated by the PN semiconductor layer is charged.

The PN semiconductor layer may comprise a p-type semiconductor formed on the transparent electrode and an n-type semiconductor formed on the p-type semiconductor.

The secondary battery layer may comprise a secondary battery anode formed on the n-type semiconductor, a polymer electrolyte layer formed on the secondary battery anode, a secondary battery cathode formed on the polymer electrolyte layer, and a current collector formed on the secondary battery cathode.

The p-type semiconductor and the n-type semiconductor may be any combination selected from the $Cu(InGa)Se_2$(p-type)-ZnO(n-type), $Cu(InGa)Se_2$(p-type)-ZnS(n-type), $Cu(InGa)Se_2$(p-type)-ZnSe(n-type), $Cu(InGa)Se_2$(p-type)-InSe(n-type), and CdSe(n-type)-In(OH,S)(p-type).

The secondary battery anode may be formed of any one selected from the group consisting of $LiM_yFe_{1-y}PO_4$, $V_2O_5$, $LiV_3O_8$, $LiCoVPO_4$, $LiM'_zCo_{1-z}O_2$, $LiCo_aNi_bMn_cO_2$ (a+b+c=1), $LiM'_zNi_{1-z}O_2$, and a mixture thereof, and the secondary battery cathode may be formed of any one selected from the group consisting of $Li_{1-x}M'_zCo_{1-z}O_2$, $Li_{1-x}Co_aNi_bMn_cO_2$ (a+b+c=1), $Li_{1-x}M'_zMn_{2-z}O_4$, $Li_{1-x}M'_zNi_{1-z}O_2$, $LiM_yFe_{1-y}PO_4$, and mixture thereof.

The n-type semiconductor and the secondary battery anode may be interlocked in a three-dimensional structure.

The n-type semiconductor and the secondary battery anode may be composited to form molecular nanostructures.

The transparent electrode may be formed on a rigid or flexible substrate.

The rigid substrate may be a material selected from the group consisting of glass and stainless steel, and the flexible substrate may be a material selected from the group consisting of polyimide (PI), polyethersulfone (PES), polyethyleneterephthalate (PET), and polyethylene naphthalate (PEN).

The polymer electrolyte layer may be a material selected from the group consisting of a liquid electrolyte containing a lithium salt, a conductive polymer electrolyte, and an ionic liquid.

The transparent electrode may be formed of a material capable of forming an ohmic contact with the p-type semiconductor.

The PN semiconductor layer may comprise an n-type semiconductor formed on the transparent electrode and a p-type semiconductor formed on the n-type semiconductor.

The secondary battery layer may comprise a secondary battery cathode formed on the p-type semiconductor, a polymer electrolyte layer formed on the secondary battery cathode, a secondary battery anode formed on the polymer is electrolyte layer, and a current collector formed on the second battery anode.

The p-type semiconductor and the n-type semiconductor may be any combination selected from the group consisting of $Cu(InGa)Se_2$(p-type)-ZnO(n-type), $Cu(InGa)Se_2$(p-type)-ZnS(n-type), $Cu(InGa)Se_2$(p-type)-ZnSe(n-type), $Cu(InGa)Se_2$(p-type)-InSe(n-type), and CdSe(n-type)-In(OH,S)(p-type).

The secondary battery anode may be formed of any one selected from the group consisting of $LiM_yFe_{1-y}PO_4$, $V_2O_5$, $LiV_3O_8$, $LiCoVPO_4$, $LiM'_zCo_{1-z}O_2$, $LiCo_aNi_bMn_cO_2$ (a+b+c=1), $LiM'_zNi_{1-z}O_2$, and a mixture thereof, and the secondary battery cathode may be formed of any one selected from the group consisting of $Li_{1-x}M'_zCo_{1-x}O_2$, $Li_{1-x}Co_aNi_bMn_cO_2$ (a+b+c=1), $Li_{1-x}M'_zMn_{2-z}O_4$, $Li_{1-x}M'_zNi_{1-z}O_2$, $LiM_yFe_{1-y}PO_4$, and a mixture thereof.

The p-type semiconductor and the secondary battery cathode may be interlocked in a three-dimensional structure.

The p-type semiconductor and the secondary battery cathode may be composited to form molecular nanostructures.

The transparent electrode may be formed on a rigid or flexible substrate.

The rigid substrate may be a material selected from the group consisting of glass and stainless steel, and the flexible substrate may be a material selected from the group consisting of polyimide (PI), polyethersulfone (PES), polyethyleneterephthalate (PET), and polyethylene naphthalate (PEN).

The polymer electrolyte layer may be a material selected from the group consisting of a liquid electrolyte containing a lithium salt, a conductive polymer electrolyte, and an ionic liquid.

The transparent electrode may be formed of a material capable of is forming an ohmic contact with the n-type semiconductor.

In accordance with another aspect of the present invention, there is provided a method of manufacturing a photovoltaic-charged secondary battery system comprising: (a) forming a transparent electrode on a substrate; (b) forming a PN semiconductor layer on the transparent electrode; and (c) forming a secondary battery layer on the PN semiconductor layer.

Step (b) may comprise: (b-1) forming a p-type semiconductor on the transparent electrode; and (b-2) forming an n-type semiconductor on the p-type semiconductor.

Step (c) may comprise: (c-1) forming a secondary battery anode on the n-type semiconductor; (c-2) forming a polymer electrolyte layer on the secondary battery anode; (c-3) forming a secondary battery cathode on the polymer electrolyte layer; and (c-4) forming a current collector on the secondary battery cathode.

The p-type semiconductor and the n-type semiconductor may be any combination selected from the group consisting of $Cu(InGa)Se_2$(p-type)-ZnO(n-type), $Cu(InGa)Se_2$(p-type)-ZnS(n-type), $Cu(InGa)Se_2$(p-type)-ZnSe(n-type), $Cu(InGa)Se_2$(p-type)-InSe(n-type), and CdSe(n-type)-In(OH,S)(p-type).

The secondary battery anode may be formed of any one selected from the group consisting of $LiM_yFe_{1-y}PO_4$, $V_2O_5$, $LiV_3O_8$, $LiCoVPO_4$, $LiM'_zCo_{1-z}O_2$, $LiCo_aNi_bMn_cO_2$ (a+b+c=1), $LiM'_zNi_{1-z}O_2$, and a mixture thereof, and the secondary battery cathode may be formed of any one selected from the group consisting of $Li_{1-x}M'_zCo_{1-x}O_2$, $Li_{1-x}Co_aNi_bMn_cO_2$ (a+b+c=1), $Li_{1-x}M'_zMn_{2-z}O_4$, $Li_{1-x}M'_zNi_{1-z}O_2$, $LiM_yFe_{1-y}PO_4$, and a mixture thereof.

Step (b-2) may further comprise increasing specific surface area of the n-type semiconductor using a polymer templating technique.

Step (b-2) may comprise: dispersing and drying polymer beads; depositing a material of the n-type semiconductor; and dissolving the polymer beads by heat treatment.

Step (b-2) may further comprise increasing specific surface area of the n-type semiconductor using an electrospinning technique.

The step of increasing specific surface area of the n-type semiconductor using the electrospinning technique may comprise: preparing nanofibers of a material of the n-type semiconductor by the electrospinning technique; and heat compressing the nanofibers to form twisted structures.

Step (b-2) may further comprise compositing the n-type semiconductor and the secondary battery anode to form molecular nanostructures using a solution coprecipitation method.

In step (a), the substrate may be a rigid or flexible substrate.

The rigid substrate may be a material selected from the group consisting of glass and stainless steel, and the flexible substrate may be a material selected from the group consisting of polyimide (PI), polyethersulfone (PES), polyethyleneterephthalate (PET), and polyethylene naphthalate (PEN).

The polymer electrolyte layer may be a material selected from the group consisting of a liquid electrolyte containing a lithium salt, a conductive polymer electrolyte, and an ionic liquid.

The transparent electrode may be formed of a material capable of forming an ohmic contact with the p-type semiconductor.

Step (b) may comprise: (b-1) forming an n-type semiconductor on the transparent electrode; and (b-2) forming an p-type semiconductor on the n-type semiconductor.

Step (c) may comprise: (c-1) forming a secondary battery cathode on the p-type semiconductor; (c-2) forming a polymer electrolyte layer on the secondary battery cathode; (c-3) forming a secondary battery anode on the polymer electrolyte layer; and (c-4) forming a current collector on the secondary battery anode.

The p-type semiconductor and the n-type semiconductor may be any combination selected from the group consisting of Cu(InGa)Se$_2$(p-type)-ZnO(n-type), Cu(InGa)Se$_2$(p-type)-ZnS(n-type), Cu(InGa)Se$_2$(p-type)-ZnSe(n-type), Cu(InGa)Se$_2$(p-type)-InSe(n-type), and CdSe(n-type)-In(OH,S)(p-type).

The secondary battery anode may be formed of any one selected from the group consisting of LiM$_y$Fe$_{1-y}$PO$_4$, V$_2$O$_5$, LiV$_3$O$_8$, LiCOVPO$_4$, LiM'$_z$Co$_{1-z}$O$_2$, LiCo$_a$Ni$_b$Mn$_c$O$_2$ (a+b+c=1), LiM'$_z$Ni$_{1-z}$O$_2$, and a mixture thereof, and the secondary battery cathode may be formed of any one selected from the group consisting of Li$_{1-x}$M'$_z$Co$_{1-z}$O$_2$, Li$_{1-x}$Co$_a$Ni$_b$Mn$_c$O$_2$ (a+b+c=1), Li$_{1-x}$M'$_z$Mn$_{2-z}$O$_4$, Li$_{1-x}$M'$_z$Ni$_{1-z}$O$_2$, LiM$_y$Fe$_{1-y}$PO$_4$ and a mixture thereof.

Step (b-2) may further comprise increasing specific surface area of the p-type semiconductor using a polymer templating technique.

Step (b-2) may comprise: dispersing and drying polymer beads; depositing a material of the p-type semiconductor; and dissolving the polymer beads by heat treatment.

Step (b-2) may further comprise increasing specific surface area of the p-type semiconductor using an electrospinning technique.

The step of increasing specific surface area of the p-type semiconductor using the electrospinning technique may comprise: preparing nanofibers of a material of the p-type semiconductor by the electrospinning technique; and heat compressing the nanofibers to form twisted structures.

Step (b-2) may further comprise compositing the p-type semiconductor and the secondary battery cathode to form molecular nanostructures using a solution coprecipitation method.

In step (a), the substrate may a rigid or flexible substrate.

The rigid substrate may be a material selected from the group consisting of glass and stainless steel, and the flexible substrate may be a material selected from the group consisting of polyimide (PI), polyethersulfone (PES), polyethyleneterephthalate (PET), and polyethylene naphthalate (PEN).

The polymer electrolyte layer may be a material selected from the group consisting of a liquid electrolyte containing a lithium salt, a conductive polymer electrolyte, and an ionic liquid.

The transparent electrode may be formed of a material capable of forming an ohmic contact with the n-type semiconductor.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Hereinafter, preferred embodiments of the present invention will be described in detail referring to the accompanying drawing. Prior to the description, it should be understood that the terms used in the specification and appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Hereinafter, the present invention will be described in detail with reference to the accompanying figures.

The present invention provides a photovoltaic-charged secondary battery system which integrates the function of generating current and the function of storing the generated current and maximizes the portability and convenience, while the conventional technologies as described above collect solar energy using a condenser plate and store the solar energy in a storage battery.

Especially, the photovoltaic-charged secondary battery system in accordance with the present invention can maximize the photoelectric conversion efficiency and energy storage efficiency by synthesizing a hybrid electrode material to form nanostructures by a molecular structure control, in which the hybrid electrode material has charge generation characteristics by photosensitivity like an optical semiconductor as well as charge storage characteristics like an electrode active material of a secondary battery.

At the current level of technology, since the driving voltage of the secondary battery used as an electrical energy storage layer is above 1.5 V and, especially, the driving voltage of a lithium secondary battery is above 3.5 V, it is impossible to directly charge the electrical energy generated in a solar cell layer disposed on the top. The reason for this is that all kinds of solar cells show an output voltage of about 0.4 to 1.3 V. Accordingly, as shown in the upper figure of FIG. 1, a plurality of solar cells 11 are connected in series to control an output voltage to coincide with a charging pressure of a secondary battery 10, which results in a decrease in efficiency due to a lot of internal resistance in the solar cells.

Figure 1:
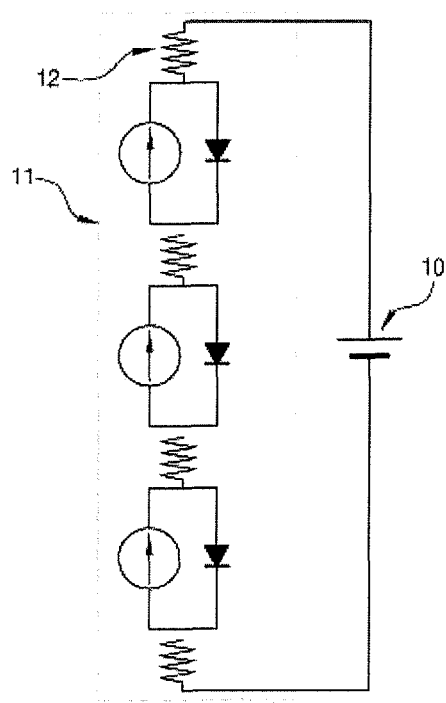
FIG. 1 is diagrams illustrating methods of connecting a second battery to photovoltaic cells, in which the upper figure shows a conventional method of connecting a second battery to solar cells and the lower figure shows a secondary battery connection method of integrating photovoltaic cells in accordance with the present invention.
Figure 1:
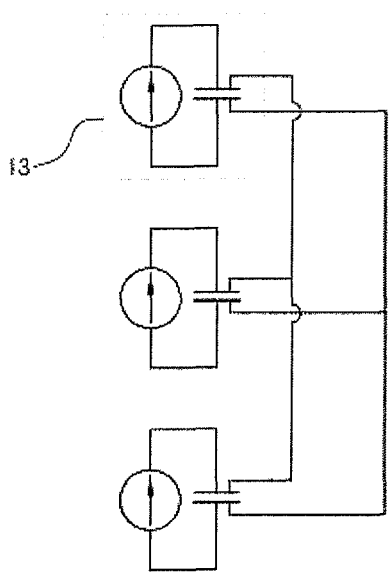

Accordingly, in order to eliminate the decrease in efficiency due to the modulation of the solar cells and enable direct charging in the energy storage layer without loss of electrical energy generated from the solar cells, 1) the photovoltaic cells 13 are integrated with the secondary battery as shown in the lower figure of FIG. 1; 2) the operational voltage of the secondary battery layer is controlled to enable the charging operation in the range of 0.4 to 1.3 V; and 3) the secondary battery layer can be implemented on a flexible substrate as well as a rigid substrate to expand the application and improve the durability, while showing about the same cycle characteristics as the existing secondary batteries.

Moreover, in order to store the output voltage generated from the photovoltaic cells in the secondary battery layer without loss, the present invention provides a secondary battery which employs a metal oxide or a metal phosphate as cathode and anode materials of the second battery layer.

The metal oxide and the metal phosphate which can be used in the is present invention may include $A_xM_yO_2$ (A=Li, Na or K; M=metal cation; $0<=x<=1$; $0.5<=y<=2$), $A_x(M_2)O_4$ (A=Li, Na or K; M=metal cation; $0<=x<=2$), $LiMPO_4$ (M=metal cation).

As the anode material, any one selected from the group consisting of $LiM_yFe_{1-y}PO_4$, $V_2O_5$, $LiV_3O_8$, $LiCoVPO_4$, $LiM'_zCo_{1-z}O_2$, $LiCo_aNi_bMn_cO_2$ (a+b+c=1), $LiM'_zNi_{1-z}O_2$ and a mixture thereof may be used.

As the cathode material, any one selected from the group consisting of $Li_{1-x}M'_zCO_{1-z}O_2$, $Li_{1-x}Co_aNi_bMn_cO_2$ (a+b+c=1), $Li_{1-x}M'_zMn_{2-z}O_4$, $Li_{1-x}M'_zNi_{1-z}O_2$, $LiM_yFe_{1-y}PO_4$ and a mixture thereof may be used.

Next, the basic principle and configuration of the photovoltaic-charged secondary battery system having a high energy density in accordance with the present invention will be described in more detail with reference to FIG. 2.

A photoelectric conversion layer is a device that converts light into electrical energy using semiconductor characteristics and comprises a p-n junction diode in which electrons are distributed asymmetrically. Since an n-type semiconductor collects electrons (negative charges) and a p-type semiconductor collects holes (positive charges), the negative charges and the positive charges are collected at both electrodes of the p-n junction diode. When light above the band gap energy (Eg), which represents the energy difference between conduction band (Ec) and valence band (Ev), is irradiated onto the diode, the electrons receiving the light are excited from the conduction band to the valence band.

Figure 2:
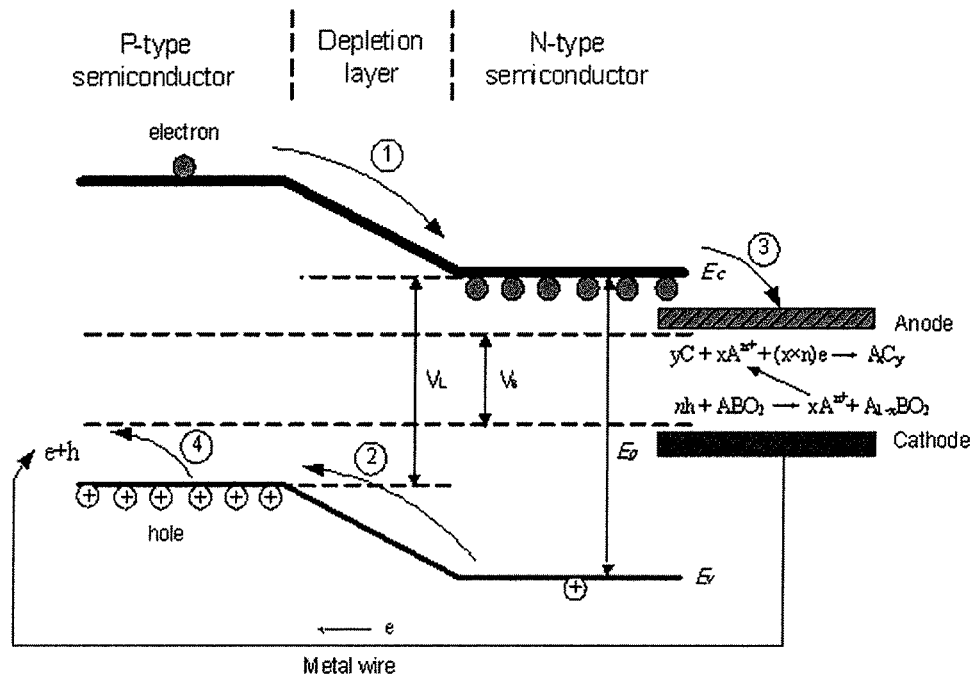
FIG. 2 is a diagram illustrating the principle of a photovoltaic-charged secondary battery system in accordance with the present invention.

That is, as shown in FIG. 2, the electrons drift from the p-type semiconductor to the n-type semiconductor by energy levels and move along path ① on the interface. Then, the electrons move toward an anode of an energy storage layer along path ③ by a potential difference, and thus energy is stored in the energy storage layer by a reduction reaction.

In FIG. 2, $V_L$ denotes a potential difference of the photoelectric conversion layer, and $V_S$ denotes a potential difference of the energy storage layer. As shown in the figure, in order to achieve the spontaneous transfer of electrons with the combination of the photoelectric conversion layer and the energy storage layer, the energy levels should be formed in the order of conduction band (n-type semiconductor)>secondary battery anode>secondary battery cathode>valence band (p-type semiconductor). Moreover, the selection of a material for constituting the energy storage layer should be made in consideration of the energy levels.

Next, a preferred embodiment of the present invention will be described in detail with reference to FIGS. 3 to 6.

Figure 3:
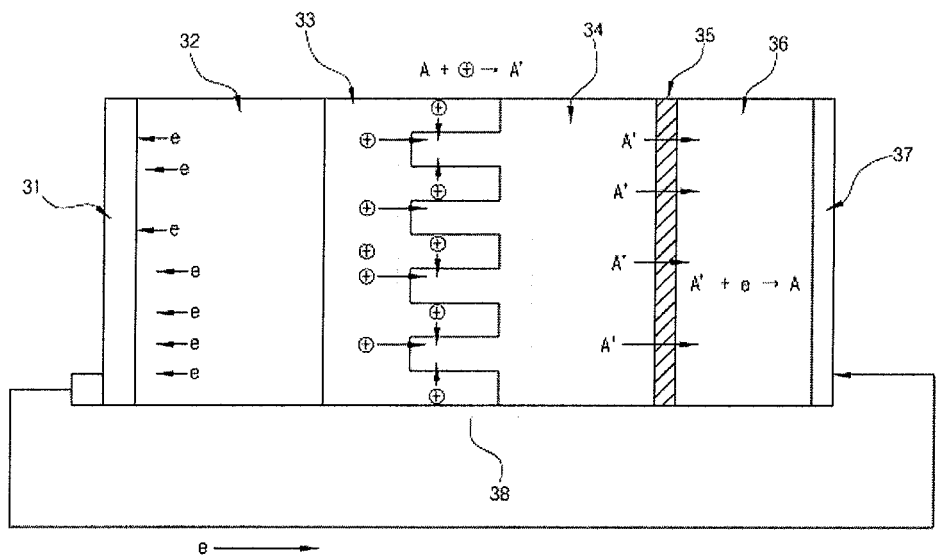
FIG. 3 is a diagram illustrating the configuration of a photovoltaic-charged secondary battery system in which a p-type semiconductor and a secondary battery cathode are interlocked in accordance with a preferred embodiment of the present invention.

FIG. 3 is a cross-sectional view illustrating an example of a photovoltaic-charged secondary battery system in accordance with a preferred embodiment of the present invention. The uppermost layer is formed of a transparent electrode 31, through which light is transmitted, an n-type semiconductor 32 is disposed therebelow, and a p-type semiconductor 33 and a secondary battery cathode 34 are interlocked 38 in a three-dimensional structure to increase the contact surface. The physical form and configuration of the interlocking 38 between two electrodes will be described in more detail later. A polymer electrolyte membrane 35 is disposed beneath the secondary battery cathode 34, and a secondary battery anode 36 and a current collector 37 made of a copper or aluminum plate are connected thereafter.

The operation of the photovoltaic-charged secondary battery system of FIG. 3 of the present invention will be described below. When receiving light, electrons are collected at the n-type semiconductor 32 and holes are collected at the p-type semiconductor 33. Then, the electrons collected at the n-type semiconductor 32 move along an external conductive wire to cause a reduction reaction at the secondary battery anode 36, and an oxidation reaction occurs in the secondary battery cathode 34 by the following Formula 1:

$$nh+ABO_2 \rightarrow xA^{n+}+A_{1-x}BO_2 \quad \text{[Formula 1]}$$

wherein h denotes a hole and $ABO_2$ denotes a component of the secondary battery cathode 34.

Meanwhile, the generated metal ion $A^{n+}$ passes through the polymer electrolyte membrane 35 to move toward the secondary battery anode 36 and electrical energy is stored by a reduction reaction by the following Formula 2:

$$yC+xA^{n+}+(X \times n)e \rightarrow A_xC_y \quad \text{[Formula 2]}$$

wherein e denotes an electron and C denotes a component of the secondary battery anode 36.

Figure 4:
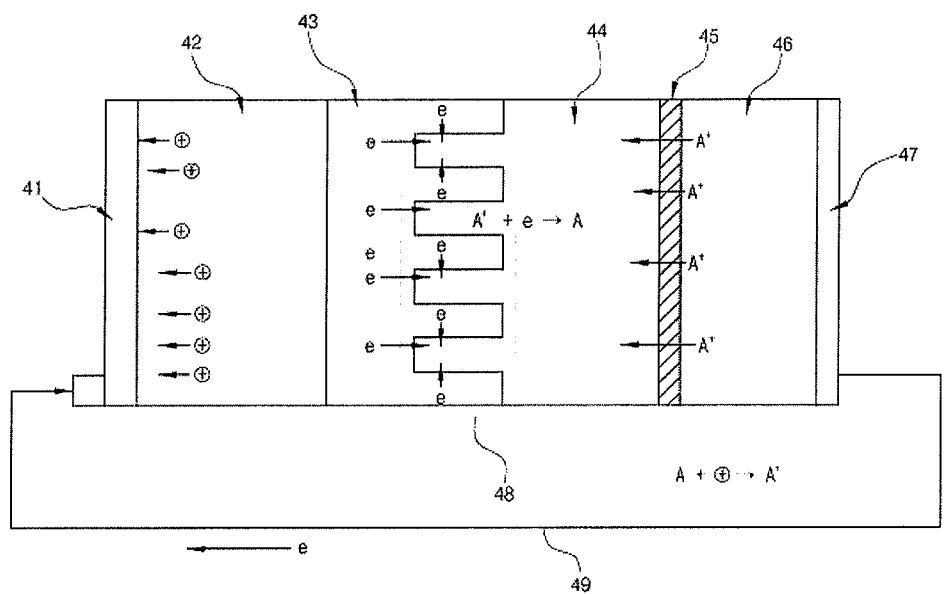
FIG. 4 is a diagram illustrating the configuration of a photovoltaic-charged secondary battery system in which an n-type semiconductor and a secondary battery anode are interlocked in accordance with another embodiment of the present invention.

FIG. 4 is a cross-sectional view illustrating another example of a photovoltaic-charged secondary battery system in accordance with another embodiment of the present invention. The uppermost layer is formed of a transparent electrode 41, through which light is transmitted, a p-type semiconductor 42 is disposed therebelow, and an n-type semiconductor 43 and a secondary battery anode 44 are interlocked 48 in a three-dimensional structure to increase the contact surface. A polymer electrolyte membrane 45 is disposed beneath the secondary battery anode 44, and a secondary battery cathode 46 and a current collector 47 made of a copper or aluminum plate are connected thereafter.

In the structure of FIG. 4, holes (+) moves from the p-type semiconductor 42 receiving light to the transparent electrode 41, and electrons (−) drifting to the n-type semiconductor 43 move along the interface to cause a reduction reaction at the secondary battery anode 44. Metal ions of the polymer electrolyte membrane 45 are reduced by a reduction reaction at the secondary battery anode 44 to cause an oxidation reaction at the secondary battery cathode 46, thus storing energy. At this time, the thus generated electrons move toward the p-type semiconductor 42 along an external conductive wire 49 and combine with the holes.

Next, the method of interlocking 38 and 48 in the three-dimensional structure will be described in detail with reference to FIGS. 8 to 11.

First, the physical configuration of the interlocked structure will be described. It is possible to fabricate two-dimensional and three-dimensional network structures for forming contact surfaces between the p-type semiconductor 33 and the secondary battery cathode 34 of the photoelectric conversion layer of FIG. 3, and between the n-type semiconductor 43 and the secondary battery anode 44 of FIG. 4, using a polymer templating technique in which polymer beads such as polymethylmethacrylate (PMMA) and polystyrene (PS) are utilized.

Figure 8:
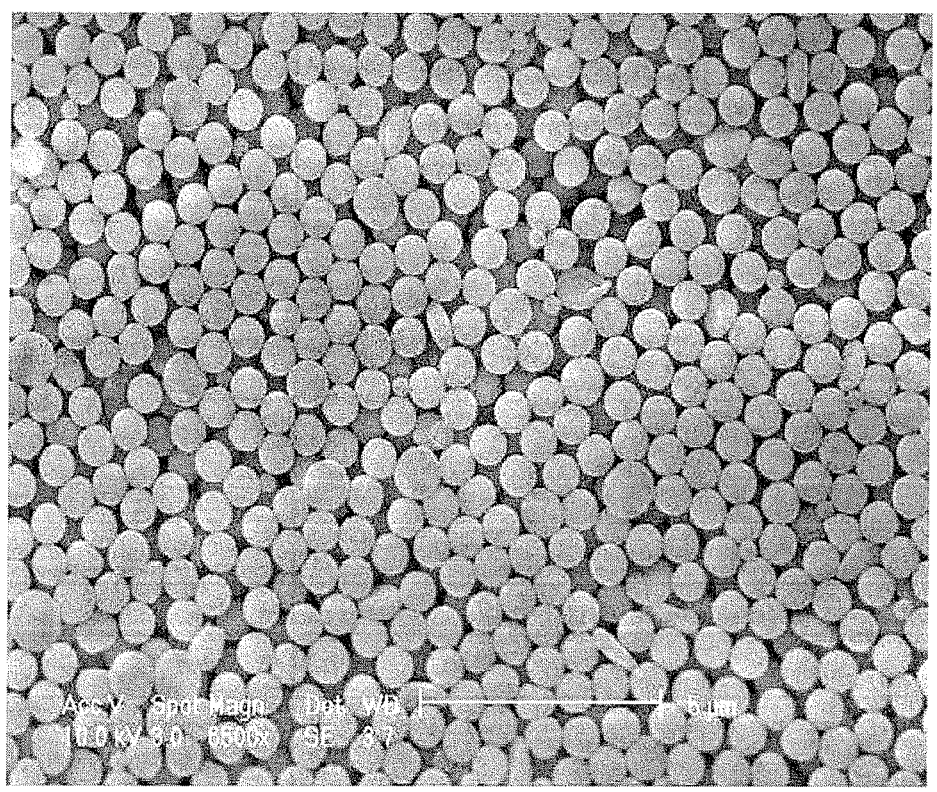
FIG. 8 is an SEM image showing spread PMMA beads.
Figure 9:
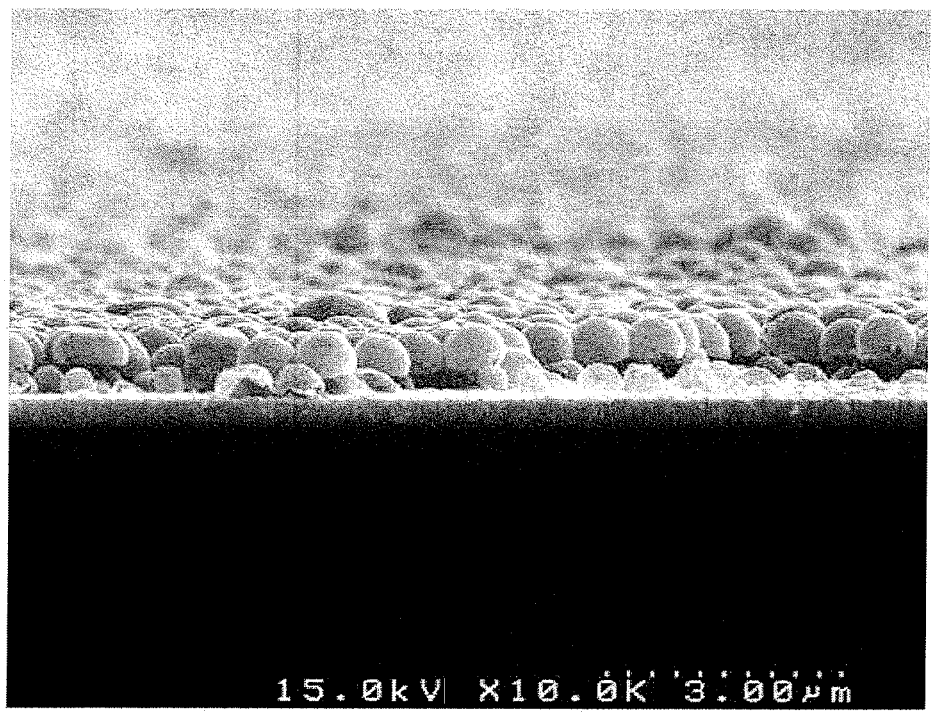
FIG. 9 is an SEM image showing ZnO hemispherical structures.
Figure 10:
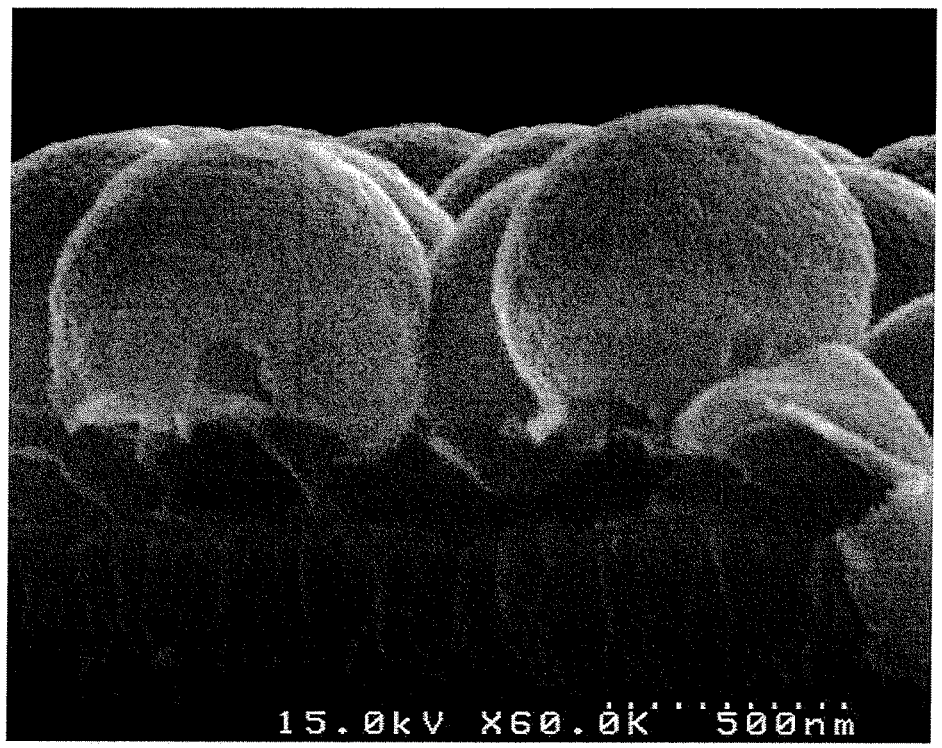
FIG. 10 is an SEM image showing enlarged ZnO hemispherical structures.
Figure 11:
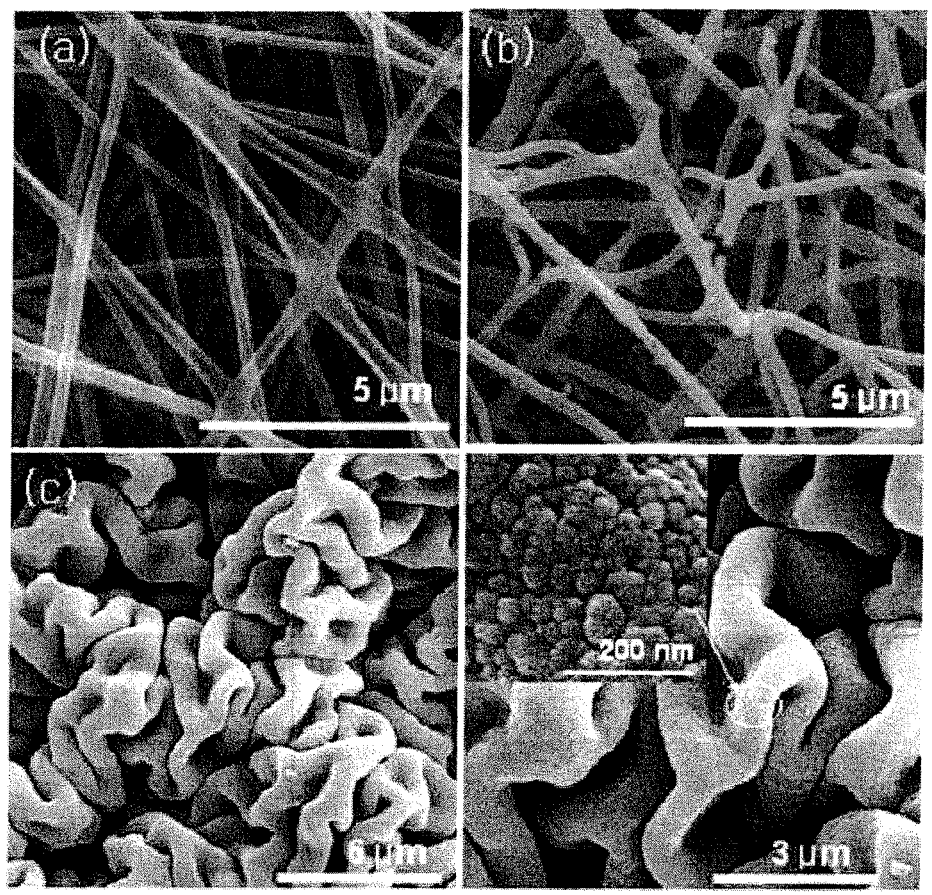
FIG. 11 is SEM images of ZnO/PVAc complex nanofibers obtained after electrospinning.

The polymer beads having various sizes are spread on a substrate and dried. For example, FIG. 8 is an SEM image showing spread PMMA beads. Next, a semiconductor material is deposited thereon using a physical deposition method such as sputtering and pulsed laser deposition (PLD) and a chemical deposition method such as chemical vapor deposition (CVD) and atomic layer deposition (ALD) at room temperature in consideration of the low glass transition temperature of the polymer. Finally, the two-dimensional network structure in which the reaction area is increased is obtained by heat treatment at a temperature capable of dissolving the polymer. Especially, since there is no limitation in selecting the semiconductor material which can be obtained through the deposition method, it is possible to employ various kinds of materials. The three-dimensional network structure can be obtained by repeated processes of the two-dimensional network structure. As an Example, as shown in FIGS. 9 and 10, the polymer templating technique can be employed to obtain two-dimensional $SnO_2$ and ZnO network structures.

Meanwhile, as the chemical method for fabricating the three-dimensional interlocked structure, it is possible to employ a method of using nanofibers having a one-dimensional structure. Especially, in the case of the n-type metal oxide semiconductor, it is possible to fabricate the nanofibers with any material showing n-type characteristics, not limited to specific materials. The metal oxide materials include $TiO2$, ZnO and $SnO3$. As an Example, an electrospinning technique may be used to obtain the one-dimensional ZnO nanofiber network structure.

FIG. 11A is an SEM image of ZnO/PVAc complex nanofibers obtained after electrospinning, from which it can be seen that the complex nanofibers having a diameter in the range of 200 to 600 nm were well formed. Moreover, it can be seen that the nanofibers obtained without a thermocompression process were composed of ZnO having a diameter in the range of 200 to 600 nm as shown in FIG. 11B; however, the nanofibers were readily separated from the substrate due to low adhesion. In the event that the thermocompression process and heat treatment were added thereto to overcome the above problem, it can be seen that twisted structures of a peculiar shape were obtained as shown in FIGS. 11C and 11D. Moreover, it can be seen that the twisted nanofibers were composed of a single crystal ZnO as shown in the insert of FIG. 11D.

Next, a photovoltaic-charged secondary battery system in accordance with another embodiment of the present invention, in which a p-type semiconductor and a cathode or an n-type semiconductor and an anode are composited to form one electrode will be described below.

Figure 5:
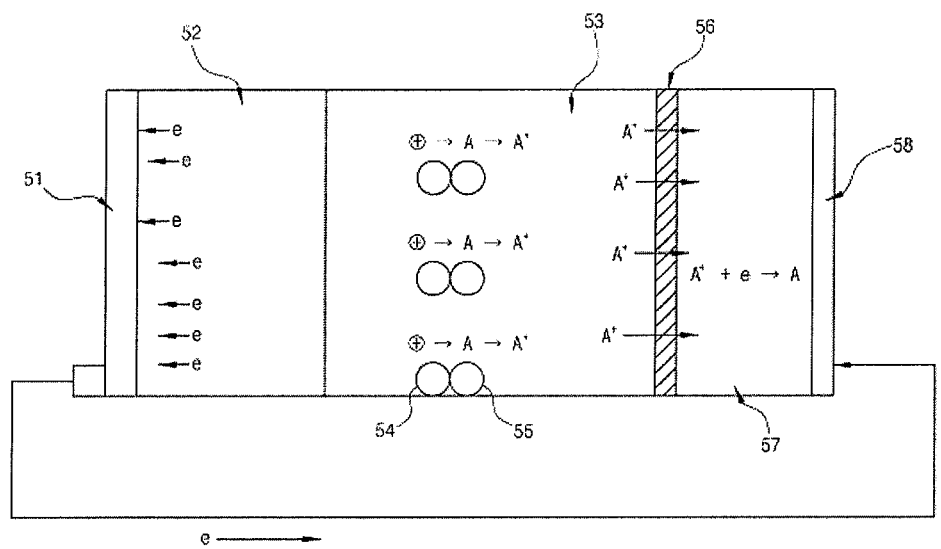
FIG. 5 is a diagram illustrating the configuration of a photovoltaic-charged secondary battery system in which a p-type semiconductor and a secondary battery cathode are composited in accordance with another embodiment of the present invention.

In a structure shown in FIG. 5, the p-type semiconductor 33 and the secondary battery cathode 34 of FIG. 3 are composited to form nanostructures by molecular structures, and thus forming one electrode 53. Since the secondary battery cathode material 55 and the p-type semiconductor 54 are bonded to nanostructures, it eliminates the possibility that holes are destroyed while passing through the interface. The oxidation-reduction reactions of the secondary battery occur in the same manner as those of Formula 1 and Formula 2.

Figure 6:
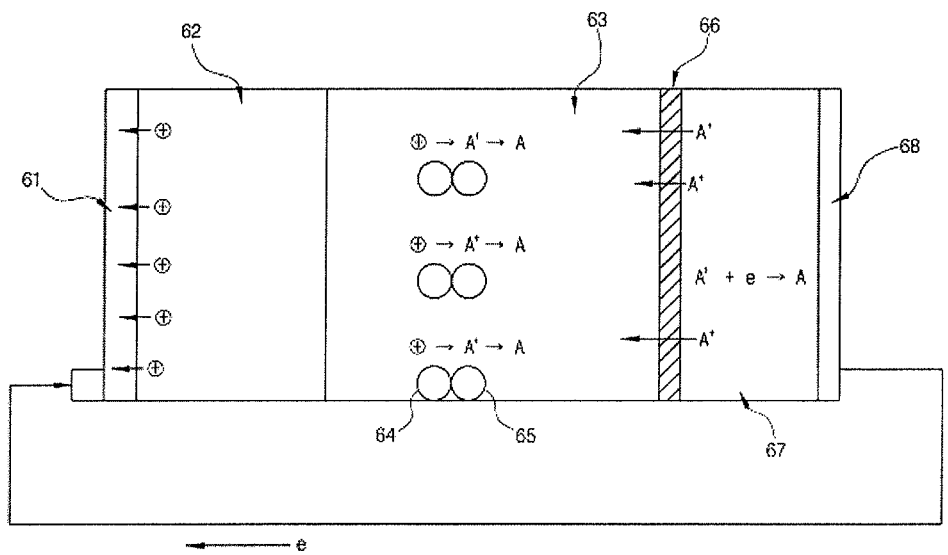
FIG. 6 is a diagram illustrating the configuration of a photovoltaic-charged secondary battery system in which an n-type semiconductor and a secondary battery anode are composited in accordance with another embodiment of the present invention.

In a structure shown in FIG. 6, the n-type semiconductor 43 and the secondary battery anode 44 of FIG. 4 are composited to form nanostructures by molecular structures, and thus forming one electrode 63. Since the secondary battery anode material 65 and the n-type semiconductor 64 are bonded to form nanostructures, the generated electrons immediately react with the secondary battery anode component by the reduction reaction of Formula 2, and thus energy is stored. Metal ions generated at the secondary battery cathode 67 by losing electrons in accordance with the oxidation reaction of Formula 1 are bonded to the secondary battery cathode 63 and 65 through a polymer electrolyte membrane 66.

The nanostructures may be formed by a solution coprecipitation method, which will be described in detail in the following Examples.

Next, the selection of a material for constituting the photoelectric conversion layer of the present invention will be described with reference to FIG. 7.

Figure 7:
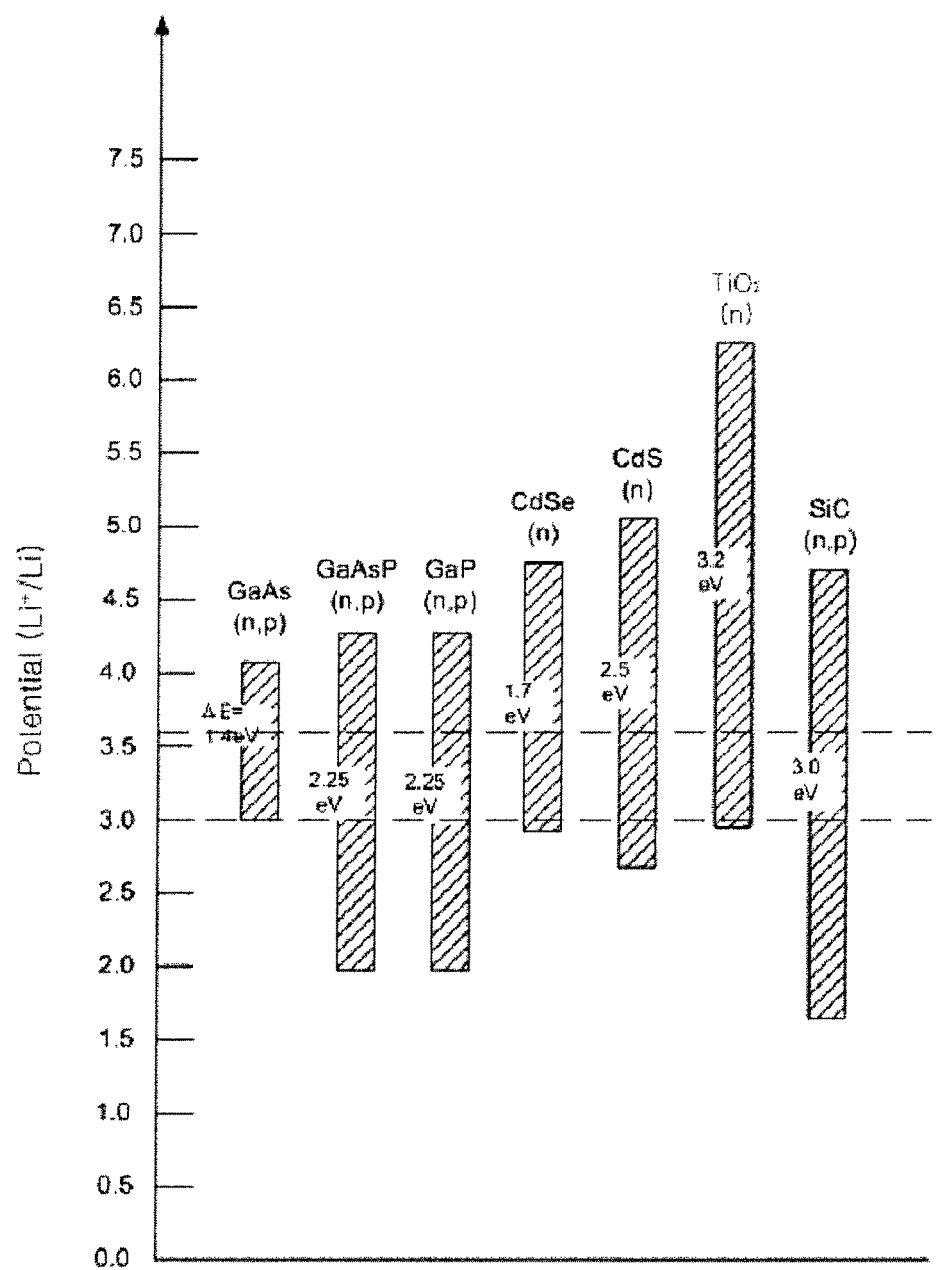
FIG. 7 is a graph illustrating the selection range of materials of a photovoltaic-charged secondary battery system in accordance with the present is invention.

FIG. 7 is a graph illustrating potentials relative to the normal hydrogen electrode (NHE) of respective semiconductor materials varied by energy potentials relative to lithium ions. The energy levels of metal oxides, which are lithium secondary battery electrode materials, are in the range of 3.0 to 4.0 V. Accordingly, it is possible to select various materials for the compound semiconductor photoelectric conversion layer and the secondary battery electrode capable of satisfying the above-described energy level conditions.

For example, in the event that CdS is used as the n-type semiconductor in FIG. 7, it is possible to use $CuInSe_2$, $CuGaSe_2$, $CuInS_2$, $Cu(InAl)Se_2$, and $Cu(InGa)Se_2$ as the p-type semiconductor. Accordingly, it is possible to combine the n-type semiconductor and the p-type semiconductor like $Cu(InGa)Se_2$(p-type)-ZnO(n-type), $Cu(InGa)Se_2$(p-type)-ZnS(n-type), $Cu(InGa)Se_2$(p-type)-ZnSe(n-type), $Cu(InGa)Se_2$(p-type)-InSe(n-type), and CdSe(n-type)-In(OH,S)(p-type).

Meanwhile, as the polymer electrolyte membranes 35, 45, 56 and 66, it is possible to use a liquid electrolyte containing a lithium salt, a conductive polymer electrolyte, and an ionic liquid.

As a substrate material, a metal thin plate such as stainless steel foil, titanium (Ti) foil, copper (Cu) foil, aluminum (Al) foil, and nickel (Ni) foil, and a polymer substrate such as polyethylene naphthalate (PEN), polyimide (PI), and polyethyleneterephthalate (PET) may be used. In the event that the polymer substrate is used, it may be coated with metal such as Al, Cu, Ti, Ni, etc. to provide an electrical conductivity.

The secondary battery layer of the present invention is fabricated in such a manner that the anode layer, the electrolyte layer, and the cathode layer are sequentially stacked on the n-type semiconductor, or the cathode layer, the electrolyte layer, and the anode layer are sequentially stacked on the p-type semiconductor. In the stacking method, it is possible to fabricate the respective layers in the form of a thin film using a vacuum deposition method or coat the electrode in the form of powder by mixing with a conductive material or a binder.

Meanwhile, as the substrate of the photovoltaic-charged secondary battery, it is possible to use both a rigid substrate such as a glass or stainless steel and a flexible substrate such as an opaque or transparent polymer film, e.g., PI, PES, PET and PEN. Accordingly, in case of the flexible substrate, since PI can be used at the processing temperature of below about 250° C. and PES, PET and PEN can be used at the processing temperature of below about 120° C., the deposition method of the metal thin film for fabricating the aluminum or metal electrode is limited to sputtering or electron cyclotron resonance chemical vapor deposition (ECR-CVD); however, the rigid substrate can be used without restrictions on the temperature of heat treatment.

Hereinafter, preferred examples for manufacturing a photovoltaic-charged secondary battery system in accordance with the present invention will be described; however, the preferred examples are provided so that those skilled in the art can sufficiently understand the present invention, but can be modified in various forms and the scope of the present invention is not limited to the preferred examples.

Example 1

A photovoltaic-charged secondary battery system in accordance with the present Example generally had a multilayer structure, in which a lower electrode was formed on a lower flexible substrate, a light absorbing layer was formed thereon, a buffer layer was formed thereon, a window layer was formed thereon, and a secondary battery layer was formed thereon. In accordance with the present invention, a secondary battery anode layer was used as an upper electrode.

In order to form a transparent flexible lower electrode, indium tin oxide ITO was deposited on a high heat-resistant flexible substrate such as Arylite, colorless PI, or Upilex by sputtering, or fluorine-doped $SnO_2$ was deposited in a thickness of 0.08 to 0.1 μm by the electron cyclotron resonance chemical vapor deposition (ECR-CVD) method, disclosed in Korean Patent No. 10-0613405. The lower electrode may be formed of any material forming a minimum contact resistance with or an ohmic contact with p-type $Cu(In,Ga)(Se,S)_2$ (hereinafter referred to as "CIS"), for example, used as a light absorbing layer to be described later. Moreover, a composite membrane including a metal, such as Mo, Cr, Ni, Pt, Pd, etc., having a work function greater than the electron affinity of CIS or including an oxide layer such as NiO, $Al_2O_3$, ZnO, etc. may be used. In the event that the metal is used as the lower transparent electrode, since it is not transparent, the metal may be formed with a thickness of less than 20 nm, or the lower electrode may be patterned to increase the aperture ratio. Moreover, to minimize the resistance of the lower electrode, it is preferable that a patterned metal electrode is first formed as a bus electrode and then an oxide electrode having high solar transmittance is additionally formed. Meanwhile, in the event that a material having a work function smaller than the electron affinity of CIS is used, the efficiency of the photovoltaic cell may deteriorate; however, such a material may be used.

The p-type semiconductor light absorbing layer was formed on the lower electrode using a material having a high absorption efficiency in the visible light range of 400 nm to 800 nm selected from wide band gap semiconductor materials such as CIS, CdTe, and the like. For example, metal elements of Cu, In, Ga and Se may be deposited in a high vacuum chamber at the same time and heated up to a predetermined temperature, e.g., 400° C. in case of PI, thus forming a CIS thin film layer in a thick of about 2 to 3 μm. In this case, the deposition of the CIS layer may be carried out in three steps to maximize the photoelectric conversion efficiency. That is, (In,Ga)Se is first deposited, CuSe layer is deposited, and (In,Ga)Se is repeatedly deposited in the third step, thus forming the CIS layer in which the Cu concentration of the middle region thereof is increased. The thus formed CIS layer was subjected to a heat treatment at a high temperature above 380° C. in an atmosphere of Se or a mixed gas of $H_2Se+H_2S$ for several to 30 minutes, and thus converted into a $Cu(In,Ga)Se_2$ semiconductor layer. The substrate on which the formation of the light absorbing layer was completed was patterned to define unit cells. The patterning process may be performed by a laser or mechanical scribing method. Preferably, the mechanical scribing method was employed to minimize the damage of an underlying layer.

The buffer layer was formed of a wide band gap semiconductor material having a thickness of about 50 nm such as CdS, ZnS, ZnSe, and $In(OH)_xS_y$, and, preferably, CdS capable of facilitating the film formation. A chemical bath deposition (CBD) method, in which Cd acetate and $(H_2N)_2CS$ were used as raw materials of Cd and S, and $NH_3$ was used as a pH regulator, was employed for the CdS deposition. The reaction vessel containing the raw materials and ammonia was heated in a water bath and stirred in a temperature range of 65 to 95° C. for 1 to 30 minutes to obtain a target thickness. The lower the temperature of the substrate, the lower the deposition rate; however, it is possible to effect a thin film having excellent light transmittance. The substrate on which the formation of the buffer layer was completed was washed by distilled water and dried to be subjected to the next process.

The n-type semiconductor window layer was fabricated by forming ZnO in the form of nanorods or microrods using a chemical solution method. The ZnO microrods were formed by dip coating ZnO nanoparticles on a substrate, immersing the resulting substrate in a solution, mixed with zinc nitrate and hexamethylenetetramine (HMTA) in the same molar ratio, and maintaining the temperature in the range of 80 to 95° C. Since the substrate removal rate determines the distribution density of the nanoparticles during the dip coating process, it is necessary to appropriately adjust the substrate removal rate in view of the optimum distribution density of the final nanorods. The growth time of the nanorods may be varied by the solution temperature and, for example, the growth process may proceed for 2 hours to obtain ZnO nanorods with a length of 1 μm. The ZnO microrods may be formed by immersing the substrate in the solution mixed with zinc nitrate and HMTA in the same molar ratio and maintaining the temperature in the range of 60 to 95° C. A thin film in the form of nanoparticles may be first formed by maintaining the initial growth temperature sufficiently low to reduce the growth rate and the microrods may be grown in the vertical direction selectively to the nanoparticles by maintaining the growth temperature above 90° C. For example, in the event that the growth temperature is 95° C., it is possible to obtain ZnO microrods with a length of 1 μm after one-hour growth.

Subsequently, to form the secondary battery layer, an anode layer, a polymer electrolyte layer, and a cathode layer were sequentially stacked on the ZnO microrod layer formed as described above. If necessary, it is possible to form the polymer electrolyte later by impregnating a liquid or gel type electrolyte in a separator. To form the anode layer, 0.85 g of $LiFePO_4$ anode active material and 0.1 g of acetylene black (conductive material) were added to an NMP solution, in which 0.05 g of polyvinylidene fluoride binder was dissolved, and uniformed mixed using a mixer. At this time, the viscosity of the mixture was lowered to an appropriate level using the NMP solution so as to be uniformed coated on the ZnO microrod layer by gravity and capillary action. Next, the mixed electrode material was coated on the ZnO microrod layer and the thus formed electrode was heated at 120° C. under vacuum for 12 hours to remove residual solvent and moisture. Besides the above described method, it is possible to fabricate the anode layer by a chemical or physical deposition method using an appropriate target material.

The polymer electrolyte layer was formed on the anode layer as follows. 8 to 11 ml of ethylene carbonate (EC)/propylene carbonate (PC) (3:1 v/v %), 1 to 1.3 g of PAN (MW 150,000), 0.2 to 0.5 g of PVDF 761, 1 to 1.5 g of $LiCf_3SO_3$ or $LiPF_6$ as an electrolyte salt were used as raw materials. First, 1 to 1.5 g of electrolyte salt was sufficiently dissolved in the EC/PC (3:1) solvent using a stirrer. 1.3 g of PAN and 0.2 g of PVDF were placed into the completely dissolved electrolyte solution, dispersed at a rate of 300 rpm for 5 hours, and heated at about 120 to 130° C. for 2 hours, thus obtaining a pale yellow transparent electrolyte solution. The pale yellow transparent electrolyte solution completely dissolved in the reaction vessel was slowly cast on a Mylar film using a doctor blade of 100 to 200 μm to form a polymer electrolyte layer. The thus formed polymer electrolyte layer was aged at room temperature for 5 is to 20 hours and stacked on the anode layer using an electrolyte separator layer as a lithium polymer cell.

Figure 12:
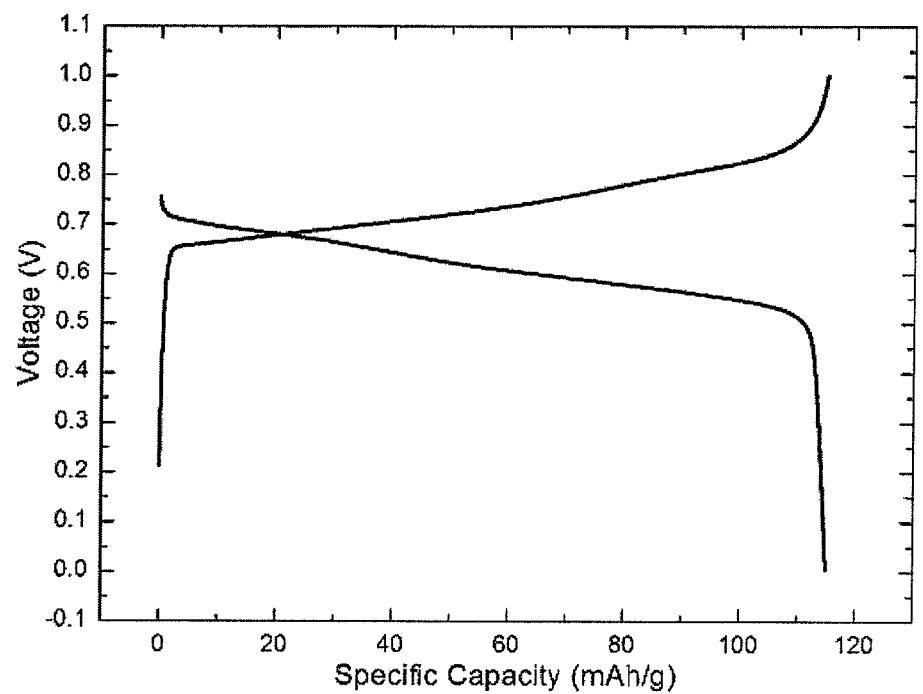
FIG. 12 is a graph showing charge/discharge curves of a photovoltaic-charged secondary battery layer when an cathode is formed of Li$_{1-x}$CoO$_2$, a anode is formed of LiFePO$_4$, a discharge current is 50 µA/g, and a termination discharge is 0.1 V.

In order to form an cathode layer on the polymer electrolyte layer, 0.94 g of $LICoO_2$ cathode active material and 0.03 g of acetylene black were mixed with an NMP solution, in which 0.03 g of polyvinytidene fluoride binder was dissolved, and coated on an aluminum plate with a thickness of 20 μm or less to provide flexibility. Next, the resulting aluminum plate was heated at 120° C. under vacuum for 12 hours to remove residual solvent and moisture. Lithium was removed from the thus formed electrode using a lithium metal as a counter electrode by an electrochemical method, thus forming $Li1-xCoO2(0<x<=0.7)$ cathode layer. In order to form a cathode layer, from which lithium is partially separated, it is possible to remove the lithium by a chemical method after the formation of a cathode active material or reduce the amount of lithium during the formation of the cathode layer. In this case, it is possible to eliminate the lithium removal process by an electrochemical method after coating and drying the raw materials on the aluminum pate. The cathode layer formed by the above method was stacked on the polymer electrolyte layer. The charge/discharge curves of the secondary battery layer are shown in FIG. 12, in which a flat potential of about 0.6 V is shown. The cathode and anode active materials may be selected from the aforementioned group other than those described in the present Example.

Example 2

A photovoltaic-charged secondary battery system in accordance with the present Example generally had a multilayer structure, in which a lower electrode was formed on a lower flexible substrate, a window layer was formed thereon, a buffer layer was formed thereon, a light absorbing layer was formed thereon, and a secondary battery layer was formed thereon. In accordance with the present invention, a secondary battery anode layer was used as an upper electrode.

In order to form a transparent flexible lower electrode, a pure metal or an alloy such as Al and AlNi was arranged in the form of a grid so that solar transmittance might be made maximally on a high heat-resistant flexible substrate such as Arylite, colorless PI, or Upilex by an electron beam evaporation method. Al layer of above 2 μm was used to reduce resistance and Ni of about 50 to 100 nm was disposed therebelow to reduce contact resistance.

The n-type semiconductor window layer was fabricated by forming ZnO in the form of nanorods or microrods using a chemical solution method. The ZnO microrods were formed by immersing a substrate in a solution mixed with zinc nitrate and hexamethylenetetramine (HMTA) in the same molar ratio and maintaining the temperature in the range of 60 to 95° C. A thin film in the form of nanoparticles may be first formed by maintaining the initial growth temperature sufficiently low to reduce the growth rate and the microrods may be grown in the vertical direction selectively to the nanoparticles by maintaining the growth temperature above 90° C. For example, in the event that the growth temperature is 95° C., it is possible to obtain ZnO microrods with a length of 1 μm after two-hour growth. In order to transfer an n-type three-dimensional shape to the light absorbing layer to be described later, the distribution of the ZnO microrods may be adjusted. That is, a ZnO layer was formed with a thickness of 50 nm by sputtering and a grid pattern at intervals of 2 μm was formed thereon using photolithography and HCl wet etching processes to be used as a seed layer of the ZnO microrods.

The buffer layer was formed of a wide band gap semiconductor material having a thickness of about 50 nm such as CdS, ZnS, ZnSe, and $In(OH)_xS_y$, and, preferably, CdS capable of facilitating the film formation was used. A chemical bath deposition (CBD) method, in which Cd acetate and $(H_2N)_2$CS were used as raw materials of Cd and S, and $NH_3$ was used as a pH regulator, was employed for the CdS deposition. The reaction vessel containing the raw materials and ammonia was heated in a water bath and stirred in a temperature range of 65 to 95° C. for 1 to 30 minutes to obtain a target thickness. The lower the temperature of the substrate, the lower the deposition rate; however, it is possible to effect a thin film having excellent light transmittance. The substrate on which the formation of the buffer layer was completed was washed by distilled water and dried to be subjected to the next process.

The p-type semiconductor light absorbing layer was formed of a material having a high absorption efficiency in the visible light range of 400 nm to 800 nm selected from wide band gap semiconductor materials such as CIS, CdTe, and the like. For example, metal elements of Cu, In, Ga and Se may be deposited in a high vacuum chamber at the same time and heated up to a predetermined temperature, e.g., 400° C. in case of PI, thus forming a CIS thin film layer in a thick of about 2 μm. In this case, the deposition of the CIS layer may be carried out in three steps to maximize the photoelectric conversion efficiency. That is, (In,Ga)Se is first deposited, CuSe layer is then deposited, and (In,Ga)Se is repeatedly deposited in the third step, thus forming the CIS layer in which the Cu concentration of the middle region thereof is increased. The thus formed CIS layer was subjected to a heat treatment at a high temperature above 380° C. in an atmosphere of Se or a mixed gas of $H_2Se+H_2S$ for up to 30 minutes, and thus converted into a $Cu(In,Ga)Se_2$ semiconductor layer. The substrate on which the formation of the light absorbing layer was completed was patterned to define unit cells. The patterning process may be performed by a laser or mechanical scribing method. Preferably, the mechanical scribing method was employed to minimize the damage of an underlying layer.

Figure 13:
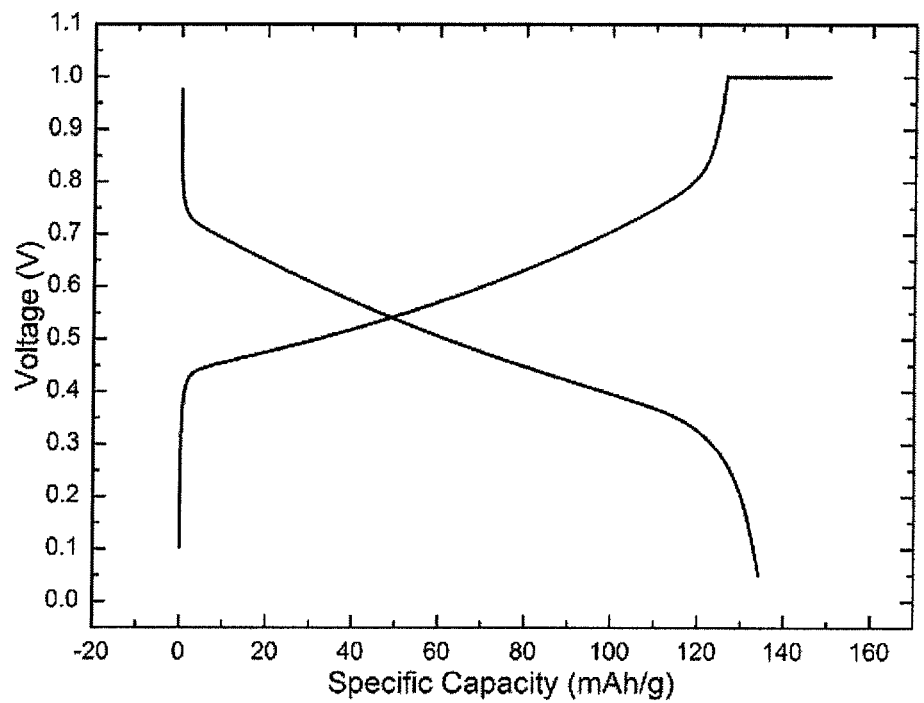
FIG. 13 is a graph showing charge/discharge curves of a photovoltaic-charged secondary battery layer when a cathode is formed of Li$_{1-x}$Co$_{1/3}$Ni$_{1/3}$Mn$_{1/3}$O$_2$, an anode is formed of LiFePO$_4$, a discharge current is 50 µA/g, and a termination discharge is 0.1 V.

Subsequently, to form the secondary battery layer, a cathode layer, a polymer electrolyte layer, and an anode layer were sequentially stacked on the CIS layer formed as described above. As the cathode layer, $Li_{1-x}Co_{1/3}Mi_{1/3}Mn_{1/3}O_2$ from which lithium was removed was used and, as the anode layer, $LiFePO_4$ was used. The manufacturing method was the same as Example 1. The charge/discharge curves of the secondary battery layer are shown in FIG. 13, in which a flat potential of about 0.5 V is shown. The cathode and anode active materials may be selected from the aforementioned group other than those described in the present Example.

Example 3

Figure 14:
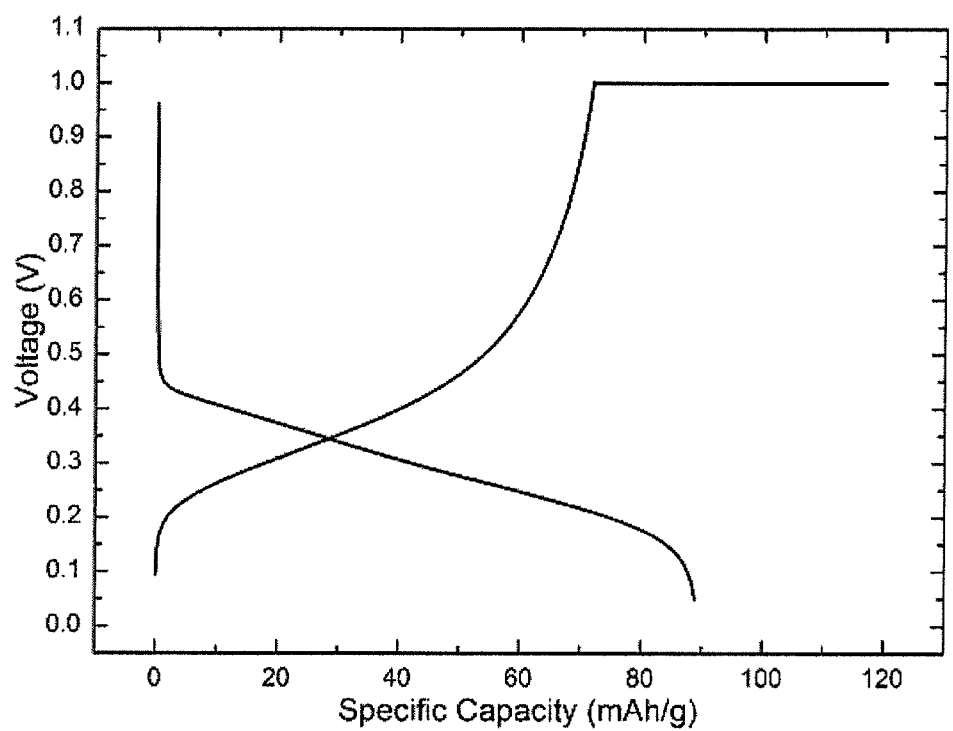
FIG. 14 is a graph showing charge/discharge curves of a photovoltaic-charged secondary battery layer when a cathode is formed of Li$_{1-x}$Mn$_2$O$_4$, an anode is formed of LiCoO$_2$, a discharge current is 50 µA/g, and a termination discharge is 0.1 V.

In order to improve the photoelectric conversion efficiency, the below-described method was employed to manufacture an n-type semiconductor having a large surface area. As the cathode layer, $Li_{1-x}Mn_2O_4$ from which lithium was removed was used and, as the anode layer, $LiCoO_2$ was used. The manufacturing method was the same as Example 1. The charge/discharge curves of the secondary battery layer are shown in FIG. 14, in which a flat potential of about 0.3 V is shown. The cathode and anode active materials may be selected from the aforementioned group other than those described in the present Example.

A polymer templating technique was employed to form a porous metal oxide semiconductor layer, in which the specific surface area was significantly increased, as described below.

First, PMMA beads having a diameter of 800 nm were dispersed. Here, the diameter of the beads may be varied. The PMMA beads (Soken Chemical & Engineering Co., Ltd.) having a concentration in a range of 0.5 to 2 wt % were added to water or a mixed solution of ethanol and water and dispersed by ultrasonic process. The resulting solution was added dropwise onto a substrate to be used or a p-type substrate (to form p-n junction of the photovoltaic cell) using a pipette and dried to obtain the PMMA beads having a multi-layer structure comprising two to three layers as shown in FIG. 8. Here, a lo monolayer template may be obtained by adjusting the concentration of the PMMA in the solution and a spin coating method may be employed. Moreover, any kind of polymer is available, if it has a spherical shape besides the PMMA beads. For example, it is possible to use various shapes of beads such as polystyrene (PS). After dispersion, the resulting PMMA beads were dried in a hood for more than 2 hours and subjected to the next process.

A metal oxide thin film for an electrode may be formed on the dispersed PMMA using a physical or chemical deposition method. In the physical deposition such as sputtering and PLD, a desired metal oxide semiconductor may be used and, in the chemical deposition, an appropriate precursor material may be used, thus forming a metal oxide thin film. Since the polymer template is sensitive to heat, the deposition process was carried out at room temperature to prevent deformation and then the polymer beads were removed by acid treatment and heat treatment. Especially, since hollowed hemispheres were formed while the PMMA beads were dissolved, a thin film, on which the specific surface area was significantly increased and the surface reactivity was enhanced, was obtained. FIG. 9 shows an SEM image of the thus formed ZnO hemispherical structures, and FIG. 10 shows an SEM image of enlarged ZnO hemispherical structures, from which it can be seen that hollowed ZnO hemispherical structures having about the same size as the originally used PMMA template were obtained.

The formation of the two-dimensional hemispherical structure illustrated in the present Example is limited to a specific material; however, any material available by room temperature deposition can be applied to various metal oxide semiconductors. Accordingly, the two-dimensional hemi-spherical structure can be effectively applied to the photoelectric conversion layer forming a p-n junction.

Example 4

In order to improve the photoelectric conversion efficiency, the below-described method was employed to manufacture an n-type semiconductor having a large surface area, and the other conditions were the same as Example 1.

Three-dimensional metal oxide semiconductor network structures were formed of ZnO nanofibers using an electro-spinning technique. A polymer solution formed by dissolving 2.4 g of polyvinyl acetate (MW 1,000,000) in 15 ml of dimethylformamide for about a day was mixed with a solution formed by dissolving 6 g of zinc acetate in 15 ml of dimethylformamide. At this time, 2 g of acetic acid was added to the mixed solution as a catalyst for a sol-gel reaction and stirred for more than 2 hours. The thus formed precursor was placed into a syringe and the syringe having the precursor was mounted to an electrospinning device. A voltage was applied between a tip of the syringe and a substrate (a sensor electrode in this case) to form nanofibers. Here, the applied voltage was about 15 kV, the flow rate was 15 μm/min, and the distance between the tip and substrate was about 10 cm. Especially, it can be observed that the microstructures of the ZnO nanofibers were varied according to the content of the acetic acid used for the sol-gel reaction. FIG. 11A shows an SEM image of ZnO/PVAc complex nanofibers obtained after electrospinning, from which it can be seen that the complex nanofibers having a diameter in the range of 200 to 600 nm were well formed. It can be seen that the nanofibers obtained without a thermocompression process were composed of ZnO having a diameter in the range of 200 to 600 nm as shown in FIG. 11B; however, the nanofibers were readily separated from the substrate due to low adhesion. In the event that the thermocompression process and heat treatment were added thereto to overcome the above problem, it can be seen that twisted structures of a peculiar shape were obtained as shown in FIGS. 11C and 11D. Moreover, it can be seen that the twisted nanofibers were composed of a single crystal ZnO as shown in the insert of FIG. 11D. The thus formed ZnO nanofibers having a one-dimensional structure may be utilized as an n-type semiconductor layer of the photovoltaic cell.

Example 5

In order to improve the efficiency of bulk heterojunction of the photoelectric conversion layers, the below-described method was employed.

A polyethylene terephthalate (PET) plate coated with indium tin oxide (ITO), fluorine-doped tin oxide ($SnO_2$:F), or fluorine-doped zinc oxide (ZnO:F) was cut to a size of 5×5, and organic materials were removed in an ultrasonic bath containing methanol and isopropanol. Poly(3,4-ethyleneedioxythiophene)-poly(styrenesulfonate) (PEDOT-PSS) (Baytron P, Bayer AG/Germany) of 100 nm or less was spin coated on the well dried PET plate to form a thin film. Poly(3-hexylthiophene) (P3HT), an n-type semiconductor material, and [6,6]-phenyl-C61-butyric acid methyl ester (PCBM), a p-type semiconductor material, in a ratio of 1:3 wt % were mixed with chlorobenzene in a ratio of 0.07 w/v % and spin coated on the PEDOT-PSS layer in a thickness of 100 to 150 nm. These materials were separated into phases. The characteristics of the photoelectric conversion layer were measured under the light condition, AM 1.5 100 mw/$cm^2$, and at an atmospheric condition. As a result, the open circuit voltage was 600 mV, the short circuit current was 6.61 mA/cm², the fill factor (FF) was 0.39, and the energy conversion efficiency was 1.54%.

Subsequently, to form the secondary battery layer, an anode layer, a polymer electrolyte layer, and a cathode layer were sequentially stacked on the P3HT layer formed as described above, and the other conditions were the same as Example 1.

Example 6

Poly(3,4-ethyleneedioxythiophene)-poly(styrenesulfonate) (PEDOT-PSS) was spin coated on a polyethylene terephthalate (PET) plate coated with indium tin oxide (ITO), fluorine-doped tin oxide ($SnO_2$:F), or fluorine-doped zinc oxide (ZnO:F) in a thickness of 30 nm to prepare a photoelectric conversion layer. A PIN structure was formed of zinc phthalocyanine (ZnPc), a p-type material, and C 60, an n-type material, on a well dried ITO/PEDOT:PSS layer using a thermal co-evaporation at $10^{-7}$ torr. First, ZnPc was deposited in a thickness of 40 nm, ZnPC:C60 1:1(v/v) was deposited, and then C60 was deposited in a thickness of 30 nm at a deposition rate of 1/S. The characteristics of the photoelectric conversion layer were measured under the light condition, AM 1.5 100 mw/cm², and at an atmospheric condition. As a result, the open circuit voltage was 570 mV, the short circuit current was 5.2 mA/cm², the fill factor (FF) was 0.51, and the energy conversion efficiency was 1.5%.

Subsequently, to form the secondary battery layer, an anode layer, a polymer electrolyte layer, and a cathode layer were sequentially stacked on the C60 layer formed as described above, and the other conditions were the same as Example 1.

Example 7

In order to improve the photoelectric conversion efficiency, an electrode layer, in which an n-type semiconductor and a secondary battery anode layer in Example 1 were composited to form molecular nanostructures, was formed using the below-described method, i.e., a solution coprecipitation method, and the other conditions were the same as Example 1.

$LiFePO_4$ anode active material particles having a diameter of several to several tens nm were mixed in a solution, in which zinc nitrate and hexamethylenetetramine (HMTA) were dissolved in the same molar ratio. A substrate was immersed in this mixed solution and the temperature was maintained in the range of 80 to 95° C., thus forming an electrode in which ZnO, the n-type semiconductor, and $LiFePO_4$, the secondary battery anode, were composited to form molecular nanostructures.

Example 8

In order to improve the photoelectric conversion efficiency, an electrode layer, in which an n-type semiconductor and a secondary battery anode layer in Example 1 were composited to form molecular nanostructures, was formed using the below-described method, i.e., a solution coprecipitation method and the other conditions were the same as Example 1.

$LiFePO_4$ anode active material particles having a diameter of several to several tens nm were mixed in a solution, in which zinc nitrate and hexamethylenetetramine (HMTA) were dissolved in the same molar ratio, and then the temperature was maintained in the range of 80 to 95° C., thus forming powder in which ZnO, an n-type semiconductor, and $LiFePO_4$, a secondary battery anode, were composited to form molecular nanostructures. The thus formed powder was coated on a substrate by a screen printing method, thus forming an electrode in which ZnO, an n-type semiconductor, and $LiFePO_4$, a secondary battery anode, were composited to form molecular nanostructures.

Example 9

A charge/discharge test of the photovoltaic-charged secondary battery system manufactured by selecting a typical photoelectric conversion layer material according to the above-described Examples 1 to 8 was carried out as follows and its performance was measured. The charge process was performed under an artificial solar source using an Air Mass (AM) 1.5 filter and white light of 100 mW/cm² was irradiated onto the photovoltaic-charged secondary battery. At this time, photovoltaic characteristics at the photovoltaic-charged secondary battery electrode were measured, and the charge process was terminated after confirming that the voltage of photovoltaic-charged secondary battery was saturated.

The typical charge/discharge curves of the secondary battery layer were shown in FIGS. 12 to 14, and the measured values of the respective Examples are shown in the following table 1. It was ascertained that the charge cycles of the photovoltaic-charged secondary battery were performed over 100 times.

TABLE 1

| | Photoelectric Conversion Layer Material | | Secondary Battery Layer | | Flat Potential | Discharge Capacity |
|---|---|---|---|---|---|---|
| Example | n-type | p-type | cathode | anode | (V) | (mAh/g) |
| 1 | ZnO | $Cu(InGa)Se_2$ | $Li_{1-x}CoO_2$ | $LiFePO_4$ | ~0.6 | 115 |
| 2 | ZnO | $Cu(InGa)Se_2$ | $Li_{1-x}Co_{1/3}Ni_{1/3}Mn_{1/3}O_2$ | $LiFePO_4$ | ~0.5 | 134 |
| 3 | ZnO | $Cu(InGa)Se_2$ | $Li_{1-x}Mn_2O_4$ | $LiCoPO_2$ | ~0.3 | 90 |
| 4 | ZnO | $Cu(InGa)Se_2$ | $Li_{1-x}CoO_2$ | $LiFePO_4$ | ~0.6 | 118 |
| 5 | P3HT | PCBM | $Li_{1-x}CoO_2$ | $LiFePO_4$ | ~0.6 | 117 |
| 6 | C60 | ZnPc | $Li_{1-x}CoO_2$ | $LiFePO_4$ | ~0.6 | 117 |

As described above, the photovoltaic-charged secondary battery system in accordance with the present invention provides the following advantageous effects:

1) It is possible to store the electrical energy generated from the photoelectric conversion layer in the electricity storage layer without electron loss, thus maximizing the energy efficiency;

2) It is possible to prevent a reduction in energy efficiency and solve the complexity of a process of connecting circuits due to a structure in which a plurality of photovoltaic cells is combined;

3) It is possible to provide a high efficiency battery coping with the speed of electricity generation of the photoelectric conversion layer;

4) It is possible to increase the energy efficiency of the photoelectric lo conversion layer and maintain a high performance even after a long term use;

5) It is possible to prevent the internal pressure from being excessively increased by the decomposition of electrolyte caused as a secondary battery layer placed at the bottom of the photoelectric conversion layer is heated to a high temperature while the photoelectric conversion layer receives and generates electricity; and 6) It is possible to solve the problem of necessity of the periodic charge, the problem of safety, the problem of limitations on an increase in capacity, and the international environmental problem, and provide excellent impact resistance and durability.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A photovoltaic-charged secondary battery system comprising:
   a transparent electrode capable of transmitting light;
   a PN semiconductor layer comprising an n-type semiconductor layer and a p-type semiconductor layer comprising a conduction band and a valence band formed on the transparent electrode and generating a current by incident light; and
   a secondary battery layer, formed on the PN semiconductor layer, in which the current generated by the PN semiconductor layer is charged,
   wherein the PN semiconductor layer and the secondary battery Layer are interlocked in a three-dimensional structure and
   wherein an anode energy level of the secondary battery layer is less than the conduction band energy level of the n-type semiconductor layer and a cathode energy level of the secondary battery layer is greater than the valence band energy level of a p-type semiconductor layer.

2. The system of claim 1, wherein the PN semiconductor layer comprises a p-type semiconductor formed on the transparent electrode and an n-type semiconductor formed on the p-type semiconductor.

3. The system of claim 2, wherein the secondary battery layer comprises a secondary battery anode formed on the n-type semiconductor, a polymer electrolyte layer formed on the secondary battery anode, a secondary battery cathode formed on the polymer electrolyte layer, and a current collector formed on the second battery cathode.

4. The system of claim 3, wherein the n-type semiconductor and the secondary battery anode are interlocked in a three-dimensional structure.

5. The system of claim 1, wherein the PN semiconductor layer comprises an n-type semiconductor formed on the transparent electrode and a p-type semiconductor formed on the n-type semiconductor.

6. The system of claim 5, wherein the secondary battery layer comprises a secondary battery cathode formed on the p-type semiconductor, a polymer electrolyte layer formed on the secondary battery cathode, a secondary battery anode formed on the polymer electrolyte layer, and a current collector formed on the second battery anode.

7. The system of claim 6, wherein the p-type semiconductor and the secondary battery cathode are interlocked in a three-dimensional structure.

8. The system of any one of claims 6 or 7, Wherein the transparent electrode is formed of a material capable of forming an ohmic contact with the n-type semiconductor.

9. A method of manufacturing a photovoltaic-charged secondary battery system comprising:
   (a) forming a transparent electrode on a substrate;
   (b) forming a PN semiconductor layer comprising an n-type semiconductor layer and a p-type semiconductor layer comprising a conduction band and a valence band on the transparent electrode; and
   (c) forming a secondary battery layer on the PN semiconductor layer,
   wherein the PN semiconductor layer and the secondary battery layer are interlocked in a three-dimensional structure and
   wherein an anode energy level of the secondary battery layer is less than the conduction band energy level of the n-type semiconductor layer and a cathode energy level of the secondary battery layer is greater than the valence band energy level of a p-type semiconductor layer.

10. The method of claim 9, wherein step (b) comprises:
    (b-1) forming a p-type semiconductor on the transparent electrode; and
    (b-2) forming an n-type semiconductor on the p-type semiconductor.

11. The method of claim 10, wherein step (c) comprises:
    (c-1) forming a secondary battery anode on the n-type semiconductor;
    (c-2) forming a polymer electrolyte layer on the secondary battery anode;
    (c-3) forming a secondary battery cathode on the polymer electrolyte layer; and
    (c-4) forming a current collector on the secondary battery cathode.

12. The method of claim 11, wherein step (b-2) further comprises increasing specific surface area of the n-type semiconductor using a polymer templating technique.

13. The method of claim 12, wherein step (b-2) comprises:
    dispersing and drying polymer beads;
    depositing a material of the n-type semiconductor; and
    dissolving the polymer beads by heat treatment.

14. The method of claim 11, wherein step (b-2) further comprises increasing specific surface area of the n-type semiconductor using an electrospinning technique.

15. The method of claim 14, wherein the step of increasing specific surface area of the n-type semiconductor using the electrospinning technique comprises:
    preparing nanofibers of a material of the n-type semiconductor by the electrospinning technique; and
    heat compressing the nanofibers to form twisted structures.

16. The method of claim 9, wherein step (b) comprises:
    (b-1) forming a n-type semiconductor on the transparent electrode; and
    (b-2) forming a p-type semiconductor on the n-type semiconductor.

17. The method of claim 16, wherein step (c) comprises:
(c-1) forming a secondary battery cathode on the p-type semiconductor;
(c-2) forming a polymer electrolyte layer on the secondary battery cathode;
(c-3) forming a secondary battery anode on the polymer electrolyte layer; and
(c-4) forming a current collector on the secondary battery anode.

18. The method of claim 17, wherein step (b-2) further comprises increasing specific surface area of the p-type semiconductor using a polymer templating technique.

19. The method of claim 18, wherein step (b-2) comprises:
dispersing and drying polymer beads;
depositing a material of the p-type semiconductor; and
dissolving the polymer beads by heat treatment.

20. The method of claim 17, wherein step (b-2) further comprises increasing specific surface area of the p-type semiconductor using an electrospinning technique.

21. The method of claim 20, wherein the step of increasing specific surface area of the p-type semiconductor using the electrospinning technique comprises:
preparing nanofibers of a material of the p-type semiconductor by the electrospinning technique; and
heat compressing the nanofibers to for twisted structures.

22. The method of claim 9 wherein the three-dimensional structure is obtained from repeating processes forming a two-dimensional network structure.

\* \* \* \* \*